United States Patent [19]

Davidson et al.

[11] 4,308,572
[45] Dec. 29, 1981

[54] ARTICLES HAVING LIGHT-EMITTING ELEMENTS ENERGIZABLE IN SEQUENCES TO PROVIDE DESIRED VISUAL DISPLAYS

[76] Inventors: Sidney Davidson; Janice Davidson, both of 5158 Collette Ave., Encino, Calif. 91316

[21] Appl. No.: 965,576

[22] Filed: Dec. 1, 1978

Related U.S. Application Data

[63] Continuation-in-part of Ser. No. 808,149, Jun. 20, 1977, abandoned.

[51] Int. Cl.³ .............................................. F21L 15/08
[52] U.S. Cl. .................................... 362/103; 362/800
[58] Field of Search ............................... 362/103–106, 362/108, 249–252, 800; 361/398

[56] References Cited

U.S. PATENT DOCUMENTS

| | | | |
|---|---|---|---|
| 1,215,389 | 2/1917 | Lauray | 362/103 X |
| 2,632,093 | 3/1953 | De Merolis et al. | 362/103 |
| 2,962,580 | 11/1960 | Jones | 362/108 |
| 3,737,647 | 6/1973 | Gomi | 362/800 X |
| 3,836,824 | 9/1974 | Watrous | 361/398 |
| 3,894,225 | 7/1975 | Chao | 362/249 |
| 3,944,803 | 3/1976 | Chao | 362/108 |
| 4,164,008 | 8/1979 | Miller et al. | 362/252 X |

*Primary Examiner*—John Gonzales
*Attorney, Agent, or Firm*—Robert J. Schaap

[57] ABSTRACT

The present invention relates to articles with light-emitting elements, such as light-emitting diodes, associated therewith, and which are energizable in sequences to provide desired visual displays. The article, preferably in the form of an article of clothing, comprises a material, usually a fabric material, having a plurality of holes arranged in a predetermined pattern. A plurality of light-emitting elements, such as the diodes, are mounted on a substrate, preferably a flexible and foldable type of printed circuit board and which diodes are sized to project through the holes so as to render an appearance that they are mounted on the surface of the fabric. A sequencer energizes the lights in a preferred sequence. In one aspect of the invention, the lights are energized with respect to an image printed on the fabric so as to depict a motion with respect to the image. In another embodiment of the invention, groups of light-emitting diodes are provided and such groups are sequentially energized so as to depict motion across a portion of the article.

33 Claims, 11 Drawing Figures

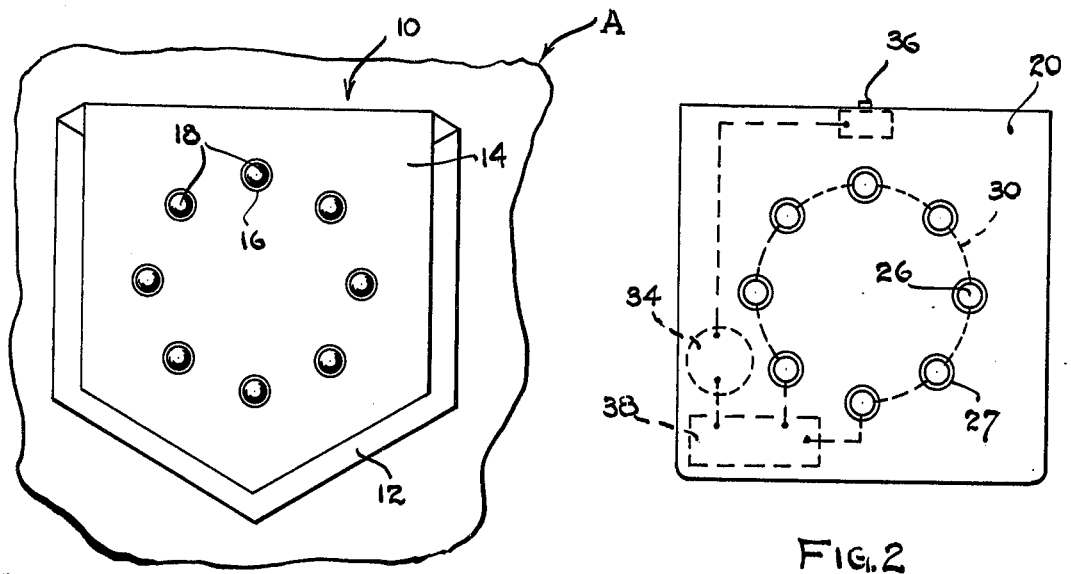
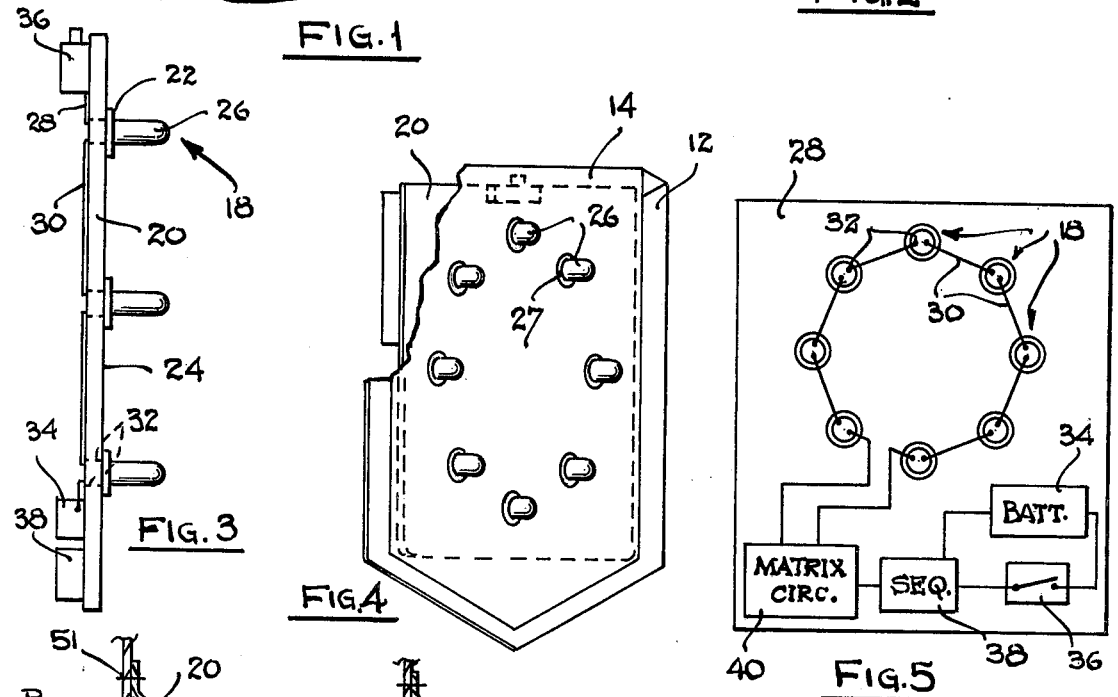
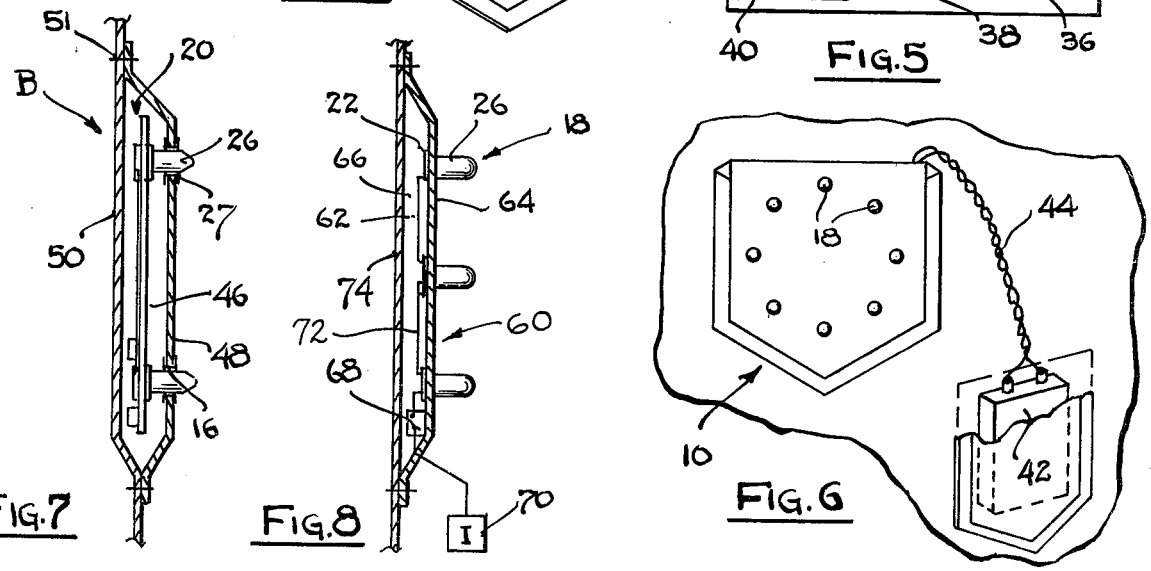

ARTICLES HAVING LIGHT-EMITTING ELEMENTS ENERGIZABLE IN SEQUENCES TO PROVIDE DESIRED VISUAL DISPLAYS

RELATED APPLICATION

This application is a continuation-in-part of our copending Application Ser. No. 808,149, filed June 20, 1977, for "ARTICLES DECORATED WITH PATTERNS OF LIGHT-EMITTING DIODES", now abandoned.

BACKGROUND OF THE INVENTION

1. Field of the Invention

This invention relates in general to certain new and useful improvements in articles having light-emitting elements mounted thereon in predetermined patterns, and, more particularly, to articles of the type stated, in which light-emitting elements are mounted on the article in certain predetermined patterns and energized in certain sequential arrangements in such predetermined patterns in order to provide desired visual displays.

2. Brief Description of the Prior Art

Various articles of clothing have been decorated with various forms of light emitting elements, such as light-emitting diodes. One such system for mounting light-emitting diodes on dresses and similar articles of clothing is more fully taught in U.S. Pat. No. 3,737,647 to Gomi. A similar form of illuminated garment is more fully illustrated in U.S. Pat. No. 2,962,480 to Jones. Various other articles of clothing, as for example, gloves and gauntlets, have been provided with light-emitting elements, as for example, U.S. Pat. No. 1,215,389 to Lauray. In addition, light-emitting elements have been mounted on belts so as to provide an illuminated safety belt as taught in U.S. Pat. No. 3,944,803 to Chao. Lamp assemblies which utilize rows of mini-lamps have been wired on a flexible substrate as taught in U.S. Pat. No. 3,894,225 to Chao.

There have been a number of problems with respect to the various prior art articles which utilize light-emitting elements, as for example, garments of the type taught in the Gomi patent. One of the desirable purposes for mounting light-emitting elements on garments or articles of wearing apparel is that of safety. The provision of lights which are energized in certain sequential patterns would be particularly important in the case of jackets and similar articles of wearing apparel used by motorcyclists, bicyclists, and others in which high visability is an important safety factor.

Heretofore, lights were mounted on articles of wearing apparel, primarily for decorative purposes, and specifically articles of wearing apparel where the lights would be subjected to little or no abuse. It is important to mount these lights with respect to these articles in such manner that they could not be easily damaged. Prior art garments which used lights mounted thereon were not adaptable for use in environments where the lights would be subjected to any abuse, as for example, in activities of bicycling or the like. Further, these prior art garments having lights mounted thereon were adapted only for indoor use since rain or even heavy humidity could short or interfere with the electrical circuitry.

The light-emitting diodes, or other light-emitting elements, generally form part of an electrical circuit which at least includes a source of power, such as a battery. In addition, an off-on switch may be provided. Further, in many cases, it is desirable to energize the lights in a certain sequence and, for this purpose, an electrically operable sequencer may be provided. The electrical components, such as the connecting pins of the light-emitting diodes and the like, should also be located so that they are not contacted by deleterious conditions in the external atmosphere.

One of the chief concerns in construction of any garment, or similar article which is of a flexible nature, is that the substrate on which the light-emitting diodes, or other light-emitting elements, are mounted must also be of a flexible and foldable nature, at least to conform to the article itself. Further, it is desirable to have these light-emitting elements mounted in a manner in which they appear to be mounted on the exterior surface of the garment, or other article. Nevertheless, it is still important to mount the various components forming part of the electrical circuitry in a manner in which the pins or contacts are hidden from view, at least for aesthetic purposes.

OBJECTS OF THE INVENTION

It is, therefore, a primary object of the present invention to provide an article having light-emitting elements mounted with respect thereto and in a desired predetermined pattern and which light-emitting elements are energizable in a desired sequence in order to present a desired visual image.

It is another object of the present invention to provide an article of the type stated in which the light-emitting elements are electrically energizable in a predetermined pattern so as to impart motion to an image imprinted on the article.

It is a further object of the present invention to provide an article of the type stated which can be made in a wide variety of forms and sizes and shapes.

It is an additional object of the present invention to provide an article of the type stated in which light-emitting elements in groups can be energized sequentially in order to generate images and to depict motion of the generated images.

It is another salient object of the present invention to provide an article of the type stated which can be provided with electronic components all mounted on a printed flexible circuit board and easily concealed from view and to provide light-emitting diodes which are mounted in such manner that they are not easily damaged.

It is yet another object of the present invention to provide an electronic circuit arrangement including a plurality of light-emitting diodes mounted thereon and which can be combined with various articles in order to produce desired light patterns with respect to the articles.

With the above and other objects in view, our invention resides in the novel features of form, construction, arrangement, and combination of parts presently described and pointed out in the claims.

SUMMARY OF THE DISCLOSURE

This invention relates particularly to articles having light-emitting elements mounted thereon and which are energizable in desired sequences to provide desired visual displays. The invention comprises an article having a material portion with front and rear surfaces, and in the case of articles of wearing apparel, the material is generally a flexible material. A plurality of holes are formed in the material and are arranged in a predetermined pattern. A plurality of light-emitting elements, and preferably light-emitting diodes, are provided and are equal in number to the number of holes. These light-emitting elements are mounted on a substrate, as for example, a printed circuit board. In addition, the substrate may contain electronic circuit connecting means, such as wires, which connect the light-emitting diodes to a source of power.

In one aspect of the invention, the articles are clothing including garments, such as pants, dresses, jackets, gloves, and the like. The invention is operable with other articles of wearing apparel including shoes, boots, belts, handbags and the like. The invention is also effective with various forms of articles, and particularly, articles which employ a flexible fabric. In this respect, while the present invention is described in connection with various article of clothing, such as pants or jackets, it should be understood that clothing and articles of wearing apparel are included within the term "garment" which is used in a broad and generic sense to include items such as luggage and similar articles. While articles such as luggage are made of a more thick and usually more rigid material, they also may be made of fabrics and also may have flexible material portions, and hence will also be included within the term "garment".

In one embodiment of the invention, the source of power may be a battery and the battery may be either mounted directly on the circuit board, or otherwise, located in a remote position and connected to the circuit board by electrical wires.

The electrical circuit, which includes the light-emitting diodes and the electronic circuit connecting means and the source of power, also includes a sequencer, and preferably an electronic-type sequencer. The sequencer is connected to the light-emitting diodes in such manner that they are switched on and off in sequence in order to create a desired visual image. The sequencer may also be mounted on the circuit board. The diodes are mounted to project through the holes in the flexible material and are visually apparent to a viewer. Further, the light-emitting diodes are mounted in such a manner that they appear to be mounted directly on the surface of the garment.

In another preferred embodiment, the light-emitting diodes are mounted on a substrate which is flexible and foldable, such as a flexible printed circuit board. For this purpose, the substrate may carry all of the electrical wiring in the form of electrical circuit means, and, preferably, may also carry a battery mounted thereon.

In the present invention, the material forming part of the article is preferably a fabric such as cotton, or plastic such as polyethylene, various vinyls, etc. Further, the material is provided with a plurality of holes in the predetermined pattern and the light-emitting elements are located in these holes in the aforesaid predetermined pattern. The lights may be sequentially energized in order to create a desired image. Further, and in one aspect of the invention, an image may be formed directly on the fabric. In this way, the lights can be energized sequentially in order to depict motion and thereby impart an image of motion to the image on the fabric. By way of example only, an image, such as an automobile, could be imprinted or otherwise formed on the fabric material and could include wheels as part of the image. A predetermined pattern of holes may be arranged in one or more of the wheels with the light-emitting elements projecting through the holes in the portion of the wheel design. Thus, when the lights are energized sequentially off and on in order, it would appear as though the wheels are rotating, thereby imparting motion to the image of the wheels.

In another embodiment of the invention, it is possible to have groups of holes arranged in predetermined patterns with the light-emitting diodes projecting through these holes in the same groups of predetermined patterns. Thus, each of the groups of diodes can be sequentially energized so as to impart motion on the garment as though the entire object were moving across the garment. Thus, by way of example only, a group of light-emitting diodes sequentially located could represent an arrow spaced with respect to a bow, the latter of which may be merely imprinted on the garment. Thus, when the lights are sequentially energized, representing the arrow, it would appear as though the arrow is moving across the garment.

This invention possesses many other advantages and has other purposes which may be made more clearly apparent from a consideration of forms in which it may be embodied. These forms are shown in the drawings accompanying and forming part of the present specification. They will now be described in detail for the purposes of illustrating the general principles of the present invention; but it is to be understood that such detailed descriptions are not to be taken in a limiting sense.

BRIEF DESCRIPTION OF THE DRAWINGS

Figure 9:
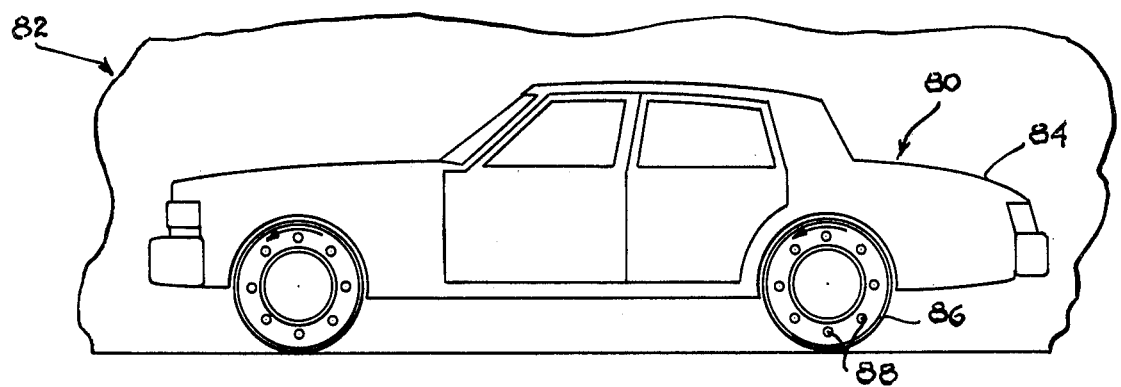
Figure 10:
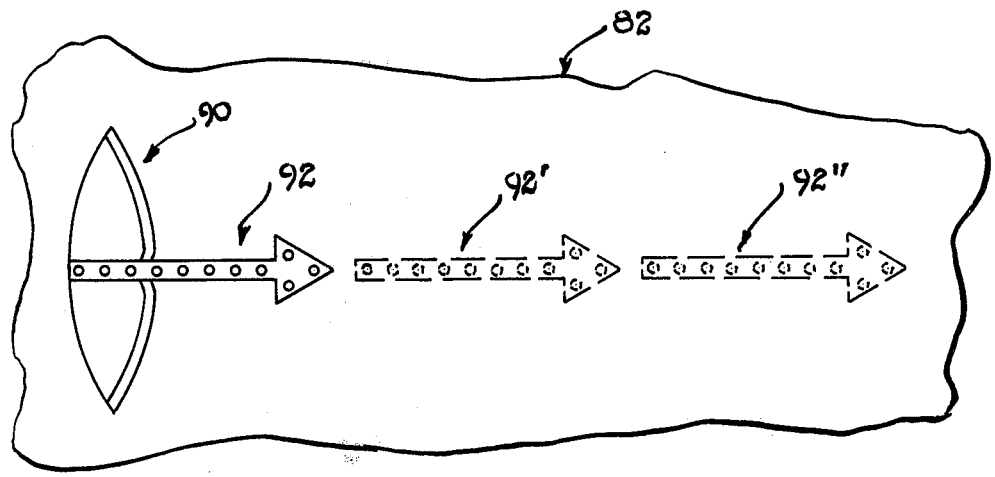
Figure 11:
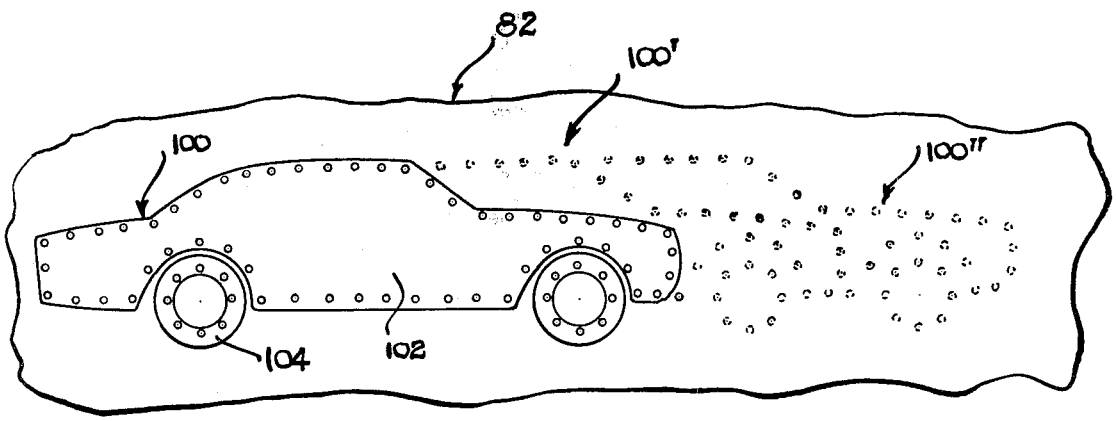

Having thus described the invention in general terms, reference will now be made to the accompanying drawings in which:

FIG. 1 is a schematic front elevational view illustrating a pocket on a garment and showing a plurality of light-emitting diodes projecting through a pattern of openings on the pocket of the garment;

FIG. 2 is a front elevation view, partially shown in dotted lines, and illustrating the circuit board pattern with the light-emitting diodes mounted thereon and which may be used in the pocket of the garment of FIG. 1;

FIG. 3 is a side elevation view showing the circuit board arrangement of FIG. 2 with the diodes mounted thereon and some of the electrical components on the rear side thereof;

FIG. 4 is a somewhat schematic perspective view, partially in section, and showing the arrangement in which the printed circuit board of FIG. 2 is located within the pocket forming part of the garment of FIG. 1 so as to have the light-emitting diodes project through the holes formed in the pocket of the garment;

FIG. 5 is a rear elevational view of a circuit board used in the article of the present invention and showing a battery, a sequencer and a matrix circuit mounted thereon, and showing the electrical connecting means;

FIG. 6 is a schematic side elevational view in which a battery and an off-on switch are connected to a circuit board located in a pocket of a garment and which battery and switch are located elsewhere in another pocket in the garment;

FIG. 7 is a vertical sectional view showing a printed circuit board inside of an enclosed area formed in a garment and covered thereover with the light-emitting diodes projecting through holes in the garment;

FIG. 8 is a vertical sectional view, similar to FIG. 7, and showing the printed circuit board itself actually forming part of the garment and having a back covering extending thereover;

FIG. 9 is a front elevational view, partially broken away, and showing a design formed on a fabric with light-emitting diodes projecting through holes in the design so as to depict motion to the design when the diodes are sequentially energized;

FIG. 10 is a front elevation view, broken away, and similar to FIG. 9, and showing a sequentially energized group of lights depicting designs of arrows; and FIG. 11 is a front elevational view, broken away, and similar to FIGS. 9 and 10, showing a garment with groups of light-emitting diodes mounted through holes in sequentially spaced patterns on the garment so as to depict motion to an image formed by the diodes projecting through the holes when sequentially energized.

DETAILED DESCRIPTION OF PREFERRED EMBODIMENTS

Referring now in more detail and by reference characters to the drawings which illustrate practical embodiments of the present invention, A designates a garment, such as an article of clothing, having a pocket 10 formed thereon. The garment A and the components forming the pocket 10 are preferably formed of a foldable and flexible fabric, such as a cotton cloth, or the like. In this case, the term "fabric" is used in a broad sense to include preferably items such as a cotton cloth, nylon and the like which are truly foldable and flexible. However, the term "fabric" is also used in the broader and generic sense to include materials such as plastics, including polyethylene, polypropylene, and other forms of plastics used in garments of the types described herein. Other materials which may form part of the fabric in accordance with the present invention are reinforced plastic composite materials which may be formed in a somewhat flexible construction.

The pocket 10 includes a first material or back panel 12 sewn or otherwise secured to the garment A and a second outer pocket panel 14 which is secured to the first panel along a seam, thereby defining a recess between the two panels 12 and 14. A plurality of openings or holes 16 are formed in the outer pocket panel 14, in the manner as illustrated in FIGS. 1 and 4 of the drawings, and are sized to snugly receive light-emitting elements, such as light-emitting diodes 18.

Referring to FIG. 4, it can be observed that the diodes 18 are positioned on a substrate 20 located within the pocket of the garment such that the light-emitting diodes 18 project through the holes 16. In this case, the substrate 20 may be a flexible printed circuit board or similar substrate formed of a flexible, foldable material and sewed or otherwise secured to either the back panel 12 or the outer pocket Panel 14 which form the pocket in the garment. For that matter, the substrate 20 could be loosely disposed in the pocket.

FIGS. 2, 3 and 5 of the drawings more fully illustrate one embodiment of the invention wherein the light-emitting diodes 18 are mounted directly on a substrate in the form of a printed circuit board. In this case, the printed circuit board 20 includes a means for mounting the diodes on the exterior surface thereof. By reference to FIG. 3, it can be observed that each of the diodes 18 are provided with a base section 22 mounted to one flat surface 24 and which constitutes the front-most surface of the circuit board 20. The means for mounting the diodes is conventional and which may be adhesives or the like. Further, the electrically conductive pins of the diodes (hereinafter described) and which extend through the substrate could serve as the mounting means.

The diodes 18 include outwardly extending portions 26 which extend through the holes 16 in the garment. The outwardly extending portions 26 are sized to snugly extend through the holes 16 so that it appears as though the only outwardly extending portion 26 is that part of the diode which is physically mounted on the surface of the garment and, in this case, the surface of the pocket formed by the panel 14. If desired, a grommet 27 may be fastened to the garment and surround each of the holes so that each outwardly extending portion 26 of each diode 18 passes through and snugly engages a grommet 27.

A rear surface 28 of the circuit board 20 is provided with electrical connecting means in the form of a plurality of copper lines, or similar electrically conductive lines 30. It can be observed, by reference to FIG. 5, that the electrical connecting lines 30 are connected to each of two pins 32 projecting through the garment from the base 22 of each of the diodes 18. The electrically conductive lines 30 may be formed on or applied to the rear surface 28 of the substrate by soldering techniques or other conventional techniques.

It has been found in connection with the present invention that foldable and flexible substrates of the type used in formation of printed circuit boards are highly effective, particularly when used in conjunction with flexible and foldable fabric materials. Moreover, the flexible circuit board constructions used in the present invention lend the necessary degree of flexibility so as to at least partially protect the light-emitting diodes from damage and breakage during folding of portions of the garment. These flexible circuit boards are relatively new in the art but are commercially available. One of the preferred flexible circuit boards is that made of silicon. It should be understood that metal foil covered with insulative fabric in areas where non-conductivity is desired could also be used as a substrate. The pins 32 of the diodes 18 project through the fabric and are connected to the electrical wiring on the rear surface of the fabric.

As indicated previously, it may be desirable to have the lights energized in a sequence. In one aspect of the invention, the lights could all simultaneously energize in sequence, that is, the lights are all first energized and then simultaneously de-energized, and thereafter energized and de-energized in proper time sequential relationship. However, in a more preferred aspect of the invention, the lights are sequentially energized on and off in sequence so that only portions of the lights are on at my period of time. Thus, by way of example only, it can be observed that each of the lights in the embodiment as illustrated in FIG. 1 could be sequentially turned on only one at a time in order, such that lights appear to rotate in the form of a circle. In this way, it would appear as though the lights were rotating on the exterior surface of the pocket.

In order to accomplish the sequential energization and deenergization of the lights, electronic circuitry is provided and the circuitry may all be mounted on a rear surface 28 of the circuit board 20. FIG. 5 more fully illustrates an arrangement in which the sequencing circuitry is provided. For this purpose, the electrical circuitry includes a source of electrical power, e.g. a battery 34, which may be in the form of a relatively small circular battery physically mounted on the rear surface 28 of the substrate 20. The battery 34 may adopt other forms, as for example, battery power packs not necessarily mounted on the substrate but electrically connected thereto could be utilized in energizing the various light-emitting diodes 18.

The light-emitting diodes 18 would be energized in response to a manually actuable switch 36 which can be turned off and on by the user thereof in order to electrically connect the various light-emitting diodes 18 to the battery source of power 34. Further, in order to sequence the lights in a certain pattern, an electronically operable sequencer 38 is also provided. In many cases, and depending on the complexity of the light patterns which are to be created, a matrix circuit 40 may be provided for ultimate connection to each of the light-emitting dioes 18. The sequencer 38 and the matrixing circuit 40 could be individually provided in the form of integrated circuit chips. Further, the sequencer 38 and matrixing circuit 40 could be combined and provided in the form of a single integrated circuit chip. By reference to FIG. 5, it can be observed that the matrix circuit 40 is connected to each of the various diodes 18. In this way, the sequencer 38 will cause the diodes to become energized in the desired arrangement in order to create the desired pattern of energized lights. For this purpose, the matrix circuit 40 may be provided with a form of switch means (not shown) in order to shift from one sequence of energization to another. In this way, by shifting the switch to a variety of positions, it is possible to generate any desired form of light pattern in which the lights are turned off and on in various sequences.

By further reference to FIG. 5, it can be observed that the various circuit components are physically mounted on the surface 28 forming part of the electronic circuit board 20. Thus, it can be observed that the battery 34, the switch 36, the sequencer 38 and the matrix circuit 40 are all physically mounted on the rear surface 28 of the circuit board 20. Further, the electrical connecting means 30 in the form of copper wires thereon are also shown. It can also be observed that some or all of the same circuit components can be physically mounted on a flexible foldable substrate type circuit board as illustrated in FIG. 3. It should be understood that the arrangement of the components in FIGS. 3 and 5 are not coordinated since the arrangement in FIG. 5, for example, is largely schematic; and the components could be essentially mounted anywhere on the circuit board or other substrate.

The switch 36, the battery 34, the sequencer 38 and the matrix circuit 40 are all conventional components. The switch may be a state-of-the-art manual switch or a switch or a switch which automatically and continuously switches the diodes on and off. An automatic type of switch which can be adapted for use in the present invention is the electronic switch more fully described in U.S. Pat. No. 3,805,047 to Robert Dockstader. The light-emitting diodes are conventional items and are readily available in the marketplace. More particularly, in one facet of the invention, it is possible to utilize light-emitting diodes which generate various colors so as to also depict a color pattern during sequential energization of the light-emitting diodes.

FIG. 6 illustrates an arrangement in which the battery 42, preferably of larger size, is located in a remote portion of a garment and is connected to the circuit board 20 in the pocket 10 by means of a pair of electrical conductors 44. In this respect, when a larger battery, such as a one-inch by two-inch battery, is employed, it is desirable to locate the battery elsewhere in the garments so as to eliminate the bulkiness in the area in which the light-emitting diodes are employed. For this purpose, the switch 36 may also be located remotely from the circuit board. In this case, the switch could be physically mounted on the battery 42 so as to cause energization and de-energization of the light-emitting diodes.

FIG. 7 illustrates an arrangement in which the entire circuit board is located in a space 46 formed in a garment B and which includes an exterior fabric layer 48. Furthermore, a back covering panel 50 extends over the portion of the rear surface of the garment fabric layer 48 in order to provide the space 46. In this case, the back panel 50 may be sewn or otherwise secured thereto as by lines of stitching 51. Located in the space 46 is the printed circuit board 20 with the outwardly extending portions 26 of the light-emitting diodes 18 projecting through the holes 16 formed therein and surrounded by the grommets 27. In this case, it appears to the viewer that the light-emitting diodes are physically mounted on the exterior surface of the fabric 48 inasmuch as they extend through and out from the exterior surface of the fabric layer 48 and are sized to snugly engage the grommets 27. The grommets 27 secured in the holes 16 snugly receive the outwardly extending portions 26 of the light-emitting diodes 18 to also prevent moisture or other deleterious elements in the atmosphere from coming in contact with the electrical components forming part of the electrical circuitry. The battery 34 and/or the switch 36 for energizing and de-energizing the circuit may be located elsewhere in the garment and electrically connected to the circuit board 20 by suitable conductors. For that matter, the substrate 20 may serve as only a mounting means with electrical connecting means for each of the light-emitting diodes and with all of the other circuit components located elsewhere and perhaps mounted on another substrate or support member. In this event, the other circuit components would be connected to the diodes by suitable conductors, preferably run inside of the garment.

FIG. 8 illustrates another embodiment of the invention in which light-emitting diodes 18 project directly through holes 16 formed in a fabric of a garment 60. In this case, the light-emitting diodes 18 have the base portions 22 mounted on a rear surface 62 of the fabric 60 and have the outwardly extending portions 26 extending beyond the front surface 64 of the fabric 60. Suitable electrically conductive wires 66 are provided for connecting the various diodes to a sequencer 68, which is also mounted on the interior surface 62 of the fabric 60. Again, and for this purpose, a battery may also be mounted directly in this portion of the garment, or otherwise remotely located. Furthermore, a switch 70 should also be remotely located and connected to the sequencer 68 by means of conductors 72.

In this latter embodiment of the invention, it can be observed that the holes were formed directly in the fabric 60 of the garment and the light-emitting diodes mounted on the rear surface of the garment to project directly through the holes. While the electrical connecting means employed was that of electrically conducting wires 66, it should be understood that these wires 66 could be secured to the interior surface of the fabric or otherwise formed thereon in the provision of electrically conductive strips. Further, the battery could have been mounted directly within the space formed by the rear surface 62 of the fabric 60, although it is preferable to locate the battery elsewhere in order to enable easy and convenient replacement of the same. Further, the components can be mounted in place and merely covered by a back panel 74 which is sewn or otherwise secured to the fabric 60.

FIG. 9 illustrates an embodiment of the present invention wherein a suitable image, as for example, an image of a vehicle, designated as 80, is imprinted on the exterior surface of a garment 82. In this case, the vehicle is provided with an image of a vehicle body 84 along with an image of wheels 86. Furthermore, provided on the periphery of each of the images of the wheels 86 are a plurality of light-emitting diodes 88 which extend through holes formed in the garment. In this case, the diodes 88 may be sequentially energized in the direction of the arrows, as illustrated in FIG. 9 so as to cause a visual image that the wheels are rotating.

FIG. 10 illustrates another embodiment of the invention in which a plurality of images are formed thereon and in which portions of the image are made up of the light-emitting diodes. In this case, it can be observed that the garment 82 is provided with an image 90 representing a bow with an additional image 92 representing an arrow. It can be observed that a portion of the arrow is painted or otherwise imprinted on the exterior surface of the fabric with the light-emitting diodes forming part of this image and located therewithin. Additional repeated images 92' and 92" representing the image of the arrow are also imprinted on or applied to the exterior surface of the garment, and sequentially spaced apart in the manner as illustrated in FIG. 10. In addition, these repeated images 92' and 92" are also made up by subsequent groups of light-emitting diodes. Thus, when the first group of light-emitting diodes located in the image 92 are energized and subsequently, the various groups of diodes in the images 92' and 92" are energized, it appears as though the arrow is travelling across a portion of the garment.

FIG. 11 illustrates another embodiment of the invention in which the garment 82 is provided with three groups of light-emitting diodes which essentially form the image itself. In other words, in this embodiment of the invention, there is not necessarily any need to use an imprinted image on the garment in addition to the groups of lights. In this case, a first group of light-emitting diodes 100 projects through the garment and which presents a design in the form of an automotive vehicle having a vehicle body 102 and wheels 104. In addition, subsequent groups of light-emitting diodes 100' and 100" are also provided. These subsequent groups of light-emitting diodes 100' and 100" also present designs or portions of designs substantially identical to that formed by the group of diodes 100. Thus, the groups of diodes 100' and 100" also present designs in the form of the vehicle and may represent the outline of the vehicle alone, or otherwise, they may be utilized in conjunction with images imprinted on the fabric itself.

It can be observed that when the first group of light-emitting diodes 100, and hence each of the subsequent groups 100' and 100", are energized, it appears as though the image of the vehicle is travelling across the garment. For this purpose, while only three such groups of light-emitting diodes have been shown, it should be understood that any number of groups could be provided and could, in fact, be located in patterns so at to cause the vehicle to travel in a pattern on the garment. Further, it can also be observed that a portion of the light-emitting diodes could also operate in a different sequence. For example, light-emitting diodes projected through holes in the pattern of the wheels 104 could also be sequentially energized in a rotating pattern, along with the various groups 100, 100' and 100" being sequentially energized. In this way, it will appear as though the image of the vehicle is moving across the garment, simultaneously with the wheels of the vehicle rotating.

The present invention is highly effective in creating garments that are used for decorative purposes and garments for safety features. For example, due to the high visual features created by the light-emitting diodes, or other light-emitting elements operating in sequence, it is easy for one to observe the wearer of the garment. For this purpose, the garment with the groups of light-emitting diodes in accordance with the present invention operating in sequence, are highly effective, particularly in cases of potential danger, as for example, to motorcyclists, bicyclists and the like. Furthermore, the sequential operating pattern of the lights is highly effective in being viewed from large distances, and particularly in poor light conditions. Thus, the present invention is highly effective in life-saving equipment, as for example, life jackets, and the like.

Thus, there has been illustrated and described unique and novel articles having light-emitting elements associated therewith, and which are operated in sequence to produce desired light patterns. Thus, the present invention fulfills all of the objects and advantages sought therefore. It should be understood that many changes, modifications, variations, and other uses and applications will become apparent to those skilled in the art after considering this specification and the accompanying drawings. Therefore, any and all such changes, modifications, variations, and other uses and applications which do not depart from the spirit and scope of the invention are deemed to be covered by the invention which is limited only by the following claims.

Having thus described our invention, what we desire to claim and secure by Letters Patent is:

1. A combination comprising an article having a flexible material with front and rear surfaces and a plurality of holes therethrough arranged in a predetermined pattern, a plurality of light-emitting elements equal in number to the number of holes, each of said light-emitting elements having a base with conductive terminal pins thereon and an outwardly extending section on said base which emits light, a source of power for energizing said light-emitting elements, a relatively thin and light weight and flexible and foldable substrate means at the rear surface of said material for mounting said light-emitting elements, said bases of said light-emitting elements being mounted on said substrate means, electronic circuit connecting means on said substrate means operatively connecting said elements to said source of power, and electronically operable sequencer means mounted on said substrate means and being coupled between said elements and said source of power for switching at least certain of said elements "on" and "off" in sequence, said elements respectively being mounted in said holes and with the outwardly extending section protruding beyond said front surface and being visually apparent to a viewer, said outwardly extending section of each of said light-emitting elements snuggly engaging the material forming the holes at the periphery of the holes so that the base and conductive terminal pins are isolated from contact with the external atmosphere at least through said holes and thereby protected from the deleterious conditions in the external atmosphere, said outwardly extending sections of said light-emitting elements being sized so that the elements appear as though they are built into the material forming part of the fabric, the flexibility and foldability of the substrate means at least partially protecting the light-emitting elements from damage and breakage during any folding of the material, said sequencer means for switching being mounted on the rear surface of said material portion and concealed from view.

2. The combination defined in claim 1 wherein said source of power includes a battery, and an "on"-"off" switch is coupled between said battery and said light-emitting elements.

3. The combination defined in claim 1 wherein said article includes a pocket on an item of clothing, and wherein said electronic circuit is mounted on a flexible printed circuit board, each of said light-emitting elements being a light-emitting diode with the diodes mounted on said board in said pattern, said printed circuit board being positioned within said pocket with the diodes thereon inserted in and protruding through said pattern of holes.

4. The combination defined in claim 3 wherein said source of power is a battery and said battery is located in said article elsewhere than in said pocket.

5. The combination defined in claim 2 wherein said switch simultaneously triggers all of said light-emitting elements to light intermittently.

6. The combination defined in claim 2 wherein said sequencer triggers said light-emitting elements in succession, so that each element lights intermittently out of phase with every other element.

7. The combination of claim 1 further characterized in that grommets are mounted on said material around each of the holes thereon and that the outwardly extending sections of the light-emitting elements pass through said grommets and snuggly engage the walls of the grommets so that the base and conductive terminal pins are isolated from contact with the external atmosphere at least through said holes.

8. The combination defined in claim 6 wherein said electronic circuit connecting means and said source of power and said substrate means for mounting and said means for switching are located beyond said rear surface of said material and which are thereby isolated from deleterious conditions in the external atmosphere contacting the front surface of said material, and where the portion of the light-emitting elements projecting through said holes remains unaffected by said deleterious conditions in the external atmosphere.

9. The combination of claim 1 wherein said light-emitting elements are located with respect to an image on an external surface of said article and appear to form part of said image and said light-emitting elements are energized in a sequence so as to depict a motion and which renders an appearance of imparting motion to said image.

10. An improved article of clothing comprised of a fabric having an outer surface exposed to the external atmosphere and an inner surface and having a plurality of holes therethrough arranged in a predetermined pattern; a plurality of light-emitting diodes equal in number to the number of holes and having a size approximately equal to the size of the holes so as to present an appearance such that the diodes are constructed on the outer surface of the fabric, each of said light-emitting diodes having a base with conductive terminal pins thereon and an outwardly extending section on said base which emits light; a battery source of power for energizing said diodes operatively connected to said diodes and being located beyond the inner surface of said fabric; a relatively thin and light weight and flexible and foldable electronic circuit receiving substrate located at the inner surface of said fabric and including means thereon for mounting said diodes; said bases of said light-emitting diodes being mounted on said substrate; flexible and bendable wire means carried by said substrate operatively connecting said terminal pins of said diodes to said source of power; and an "off"-"on" switch coupled between said source of power and said diodes for turning said diodes "off" and "on"; an electronically operable sequencer means operatively mounted on said substrate and being coupled to said wire means and diodes for energizing at least certain of said diodes in sequence, said diodes respectively being mounted so that the outwardly extending portions project through said holes and protruding beyond said outer surface and being visually apparent to a viewer, said switch being mounted with respect to the inner surface of said fabric and concealed from view, said means for mounting and said switch being located at the inner surface of said fabric and isolated from deleterious conditions in the atmosphere contacting the outer surface of said fabric, said outwardly extending section of each of said light-emitting diodes snuggly engaging the fabric forming the holes at the periphery of the holes so that the base and conductive terminal pins are isolated from contact with the external atmosphere and thereby protected from the deleterious conditions in the external atmosphere, said outwardly extending sections of said light-emitting diodes being sized so that the diodes appear as though they are built into the material forming part of the fabric, the flexibility and foldability of the substrate at least partially protecting the light-emitting diodes from damage and breakage during any folding of the fabric.

11. The article of clothing defined in claim 10 wherein said article includes a pocket on the article of clothing, and wherein said diodes are mounted on said substrate in said pattern, said substrate being positioned within said article of clothing with the diodes thereon inserted in and protruding through said pattern of holes and said switch being electrically connected to and remote from said substrate.

12. The article of clothing defined in claim 11 wherein said switch simultaneously triggers all of said diodes to light intermittently.

13. The article of clothing defined in claim 10 wherein said sequencer triggers said diodes in succession, so that each diode lights intermittently out of phase with every other diode.

14. The improved article of clothing of claim 10 wherein said diodes are located with respect to an image on an external surface of said fabric and appear to form part of said image and said diodes are energized in a sequence so as to depict a motion and which renders an appearance of imparting motion to said image.

15. The improved article of clothing of claim 10 further characterized in that grommets are mounted on said fabric around each of the holes thereon and that the outwardly extending sections of the light-emitting diodes pass through said grommets and snuggly engage the walls of the grommets so that the base and conductive terminal pins are isolated from contact with the external atmosphere at least through said holes.

16. An article comprised of a flexible fabric material portion having an exposed front surface and a rear surface, a plurality of holes therethrough arranged in a predetermined pattern, an image on said exposed front surface and being of a type capable of having motion depicted with respect thereto, said image being located in relation to said predetermined pattern of holes, a plurality of light-emitting diodes equal in number to the number of holes and having a size approximately equal to the size of the holes so as to present an appearance that the diodes are constructed on the exposed surface of the fabric, each of said light-emitting diodes having a base with conductive terminal pins thereon and an outwardly extending section on said base which emits light, said diodes being located with respect to the image on said fabric so as to appear to form part of said image, said diodes being located in said holes and protruding beyond said front surface and being visually apparent to a viewer, a flexible and foldable substrate means at the rear surface of said fabric material for mounting said light-emitting diodes, said bases of said light-emitting diodes being mounted on said substrate means, said outwardly extending section of each of said light-emitting diodes snuggly engaging the material forming the holes at the periphery of the holes so that the base and conductive terminal pins are isolated from contact with the external atmosphere at least through said holes and thereby protected from the deleterious conditions in the external atmosphere, said outwardly extending sections of said light-emitting diodes being sized so that the diodes appear as though they are built into the fabric material, the flexibility and foldability of the substrate means at least partially protecting the light-emmiting diodes from damage and breakage during any folding of the material, a source of power for energizing said diodes, electronic circuit connecting means on said substrate for connecting said diodes to said source of power, electronically operable sequencer means mounted on said substrate means and being coupled between said elements and said source of power for causing energization of at least certain of said diodes in a sequence so as to depict a motion and which renders an appearance of imparting motion to said image, said means for switching being mounted on the rear surface of said material portion and concealed from view.

17. The article defined in claim 16 wherein said source of power includes a battery, and an "on"-"off" switch is coupled between said battery and said light-emitting elements.

18. The article defined in claim 16 wherein said source of power is a battery.

19. The article defined in claim 16 wherein said switch simultaneously triggers all of said light-emitting elements to light intermittently.

20. The article defined in claim 16 wherein said sequencer triggers said light-emitting elements in succession, so that each element lights intermittently out of phase with every other element.

21. The article of claim 16 further characterized in that grommets are mounted on said fabric material around each of the holes thereon and that the outwardly extending sections of the light-emitting diodes pass through said grommets and snuggly engage the walls of the grommets so that the base and conductive terminal pins are isolated from contact with the external atmosphere at least through said holes.

22. An article having a flexible fabric material with an exposed front surface and a rear surface generally concealed from view, a first plurality of holes extending through said fabric material and arranged in a predetermined pattern to represent an image or a portion of an image on said fabric material, a second plurality of holes extending through said fabric material and arranged in substantially the same predetermined pattern to present substantially the same image or portion thereof, a first group of light-emitting diodes equal in number to the number of holes in the first plurality of holes, a second group of light-emitting diodes equal in number to the number of holes in the second plurality of holes, a flexible and foldable substrate means at the rear surface of said article for mounting said diodes, each of said light-emitting diodes having a base with conductive terminal pins thereon and an outwardly extending section on said base which emits light, said bases of said light-emitting diodes being mounted on said substrate means, said diodes being located to extend through said holes and protrude beyond the front surface of said material so as to be visually apparent to a viewer, said outwardly extending section of each of said light-emitting diodes snuggly engaging the fabric material forming the holes at the periphery of the holes so that the base and conductive terminal pins are isolated from contact with the external atmosphere at least through said holes and thereby protected from the deleterious conditions in the external atmosphere, said outwardly extending sections of said light-emitting diodes being sized so that the diodes appear as though they are built into the fabric material, the flexibility and foldability of the substrate means at least partially protecting the light-emitting diodes from damage and breakage during any folding of the fabric material, a source of power operatively connected to said diodes for energizing same, electronically operable sequencer means being electrically connected to said source of power and said diodes, said sequencer means being mounted in a position where it is concealed from view, said sequencer means causing substantially simultaneous energization of at least a portion of said first group of diodes and thereafter substantially simultaneous sequential energization of at least a portion of said second group of diodes and ultimate de-energization of said portion of said first group of diodes to depict a motion from said image represented by said first plurality of holes to the second plurality of holes and back to said first plurality of holes.

23. The article defined by claim 22 further characterized in that said sequencer means causes energization of all of said first group of light-emitting diodes and subsequently all of said second group of light-emitting diodes with de-energization of said first group of light-emitting diodes to depict movement to said image.

24. The article defined by claim 23 further characterized in that at least a third plurality of holes arranged in substantially the same predetermined pattern as said first and second plurality of holes are provided and an additional group of light-emitting diodes equal to the number of such additional plurality of holes and which are energized and de-energized in sequence with respect to said first and second groups of light-emitting diodes.

25. The article defined by claim 22 further characterized in that said sequencer means is mounted on the flexible foldable substrate means, and electrically conductive elements are on said substrate means for connecting said diodes to the source of power.

26. The article defined by claim 22 in the form of an article of clothing wherein said substrate means is a flexible printed circuit board and said diodes are mounted on a flexible printed circuit board in said patterns, said printed circuit board being positioned within said article.

27. The article defined in claim 26 wherein the sequencing means is mounted on said printed circuit board and located with respect to the inner surface of said fabric and concealed from view and isolated from deleterious conditions in the atmosphere contacting the outer surface of said fabric and where the portion of the light-emitting diodes projecting through said holes remains unaffected by said deleterious conditions in the external atmosphere.

28. The article defined in claim 27 wherein said source of power is a battery mounted on said circuit board.

29. The article of claim 22 wherein said diodes are located with respect to images on an external surface of said fabric and appear to form part of said images and said diodes are energized in a sequence so as to depict a motion to the images and which renders an appearance of imparting motion to said images simultaneously with the effect of depicting motion from one group of diodes to the other group of diodes.

30. The article of claim 22 further characterized in that grommets are mounted on said fabric material around each of the holes thereon and that the outwardly extending sections of the light-emitting diodes pass through said grommets and snuggly engage the walls of the grommets so that the base and conductive terminal pins are isolated from contact with the external atmosphere ar least through said holes.

31. A light-emitting diode arrangement for use with an article having a flexible material with front and rear surfaces and a plurality of holes therethrough arranged in a predetermined pattern, said arrangement comprising a relatively thin and light weight and flexible and foldable substrate locatable at the rear surface of said material, a plurality of light-emitting diodes mounted on said substrate equal in number to the number of holes in said material portion, each of said light-emitting diodes having a base with conductive terminal pins thereon and an outwardly extending section on said base which emits light, said bases of said light-emitting diodes being mounted on said substrate, said outwardly extending section of each of said light-emitting diodes snuggly engaging the material forming the holes at the periphery of the holes so that the base and conductive terminal pins are isolated from contact with the external atmosphere at least through said holes and thereby protected from the deleterious conditions in the external atmosphere, said outwardly extending sections of said light-emitting diodes being sized so that the diodes appear as though they are built into the material, the flexibility and foldability of the substrate at least partially protecting the light-emitting diodes from damage and breakage during any folding of the material, a source of power on said substrate means, electronic circuit connecting means on said substrate operatively connecting said diodes to said source of power, and electonically operable sequencer means mounted on said substrate and being coupled between said elements and said source of power for switching at least certain of said elements "on" and "off" in sequence.

32. The assembly of claim 31 wherein said source of power includes a battery, and an "on"-"off" switch is mounted on said substrate and coupled between said battery and said light-emitting diodes.

33. The arrangement of claim 31 further characterized in that grommets are mounted on said material around each of the holes thereon and that the outwardly extending section of the light-emitting diodes pass through said grommets and snuggly engage the walls of the grommets so that the base and conductive terminal pins are isolated from contact with the external atmosphere at least through said holes.

* * * * *